(12) United States Patent
Black et al.

(10) Patent No.: US 7,041,607 B2
(45) Date of Patent: May 9, 2006

(54) METHOD FOR FABRICATING CRYSTALLINE-DIELECTRIC THIN FILMS AND DEVICES FORMED USING SAME

(75) Inventors: Charles Black, White Plains, NY (US); Christopher Bruce Murray, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/784,593

(22) Filed: Feb. 23, 2004

(65) Prior Publication Data

US 2004/0164363 A1   Aug. 26, 2004

Related U.S. Application Data

(62) Division of application No. 10/266,000, filed on Oct. 7, 2002, now Pat. No. 6,737,364.

(51) Int. Cl.
  *H01L 21/336* (2006.01)
(52) U.S. Cl. .................. 438/778; 438/287; 257/410
(58) Field of Classification Search ............. 438/778, 438/287; 257/410
See application file for complete search history.

(56) References Cited

U.S. PATENT DOCUMENTS

| | | | |
|---|---|---|---|
| 6,254,662 B1 | 7/2001 | Murray et al. | 75/348 |
| 6,262,129 B1 | 7/2001 | Murray et al. | 516/33 |
| 6,265,021 B1 | 7/2001 | Black et al. | 427/131 |
| 6,302,940 B1 | 10/2001 | Murray et al. | 75/348 |
| 6,416,855 B1 | 7/2002 | Rossignol et al. | 428/323 |
| 6,440,213 B1 * | 8/2002 | Alivisatos et al. | 117/68 |
| 6,558,448 B1 | 5/2003 | Hu | 75/252 |
| 6,603,139 B1 * | 8/2003 | Tessler et al. | 257/40 |

FOREIGN PATENT DOCUMENTS

JP    4-139005 A    5/1992

* cited by examiner

*Primary Examiner*—David Nelms
*Assistant Examiner*—Renee R. Berry
(74) *Attorney, Agent, or Firm*—Connolly, Bove, Lodge & Hutz, LLP; Wan Yee Cheung

(57) ABSTRACT

This invention describes a new method for forming and depositing thin films of crystalline dielectric materials. The present technique uses chemical synthesis to control the granularity and thickness of the dielectric films. This method has several key advantages over existing technologies, and facilitates the integration of crystalline dielectric materials into high-density memory devices.

5 Claims, 3 Drawing Sheets

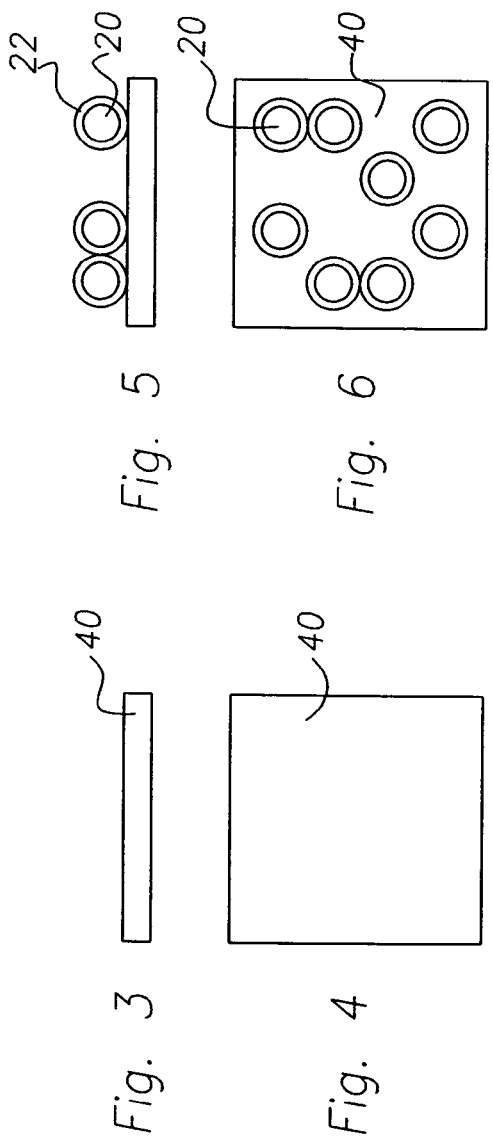

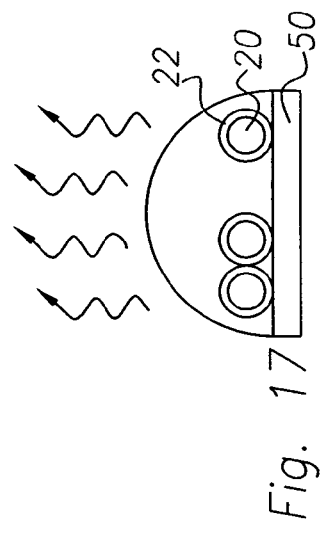
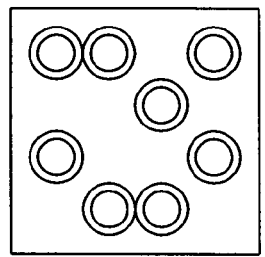
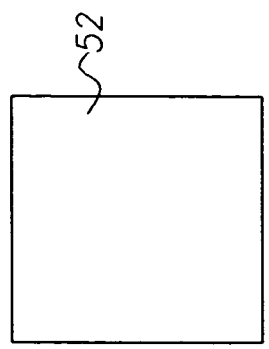
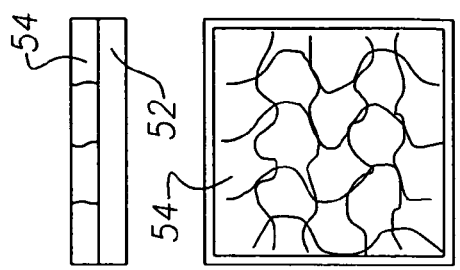
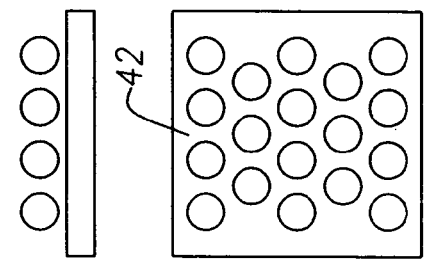
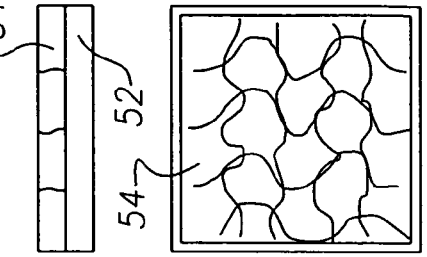
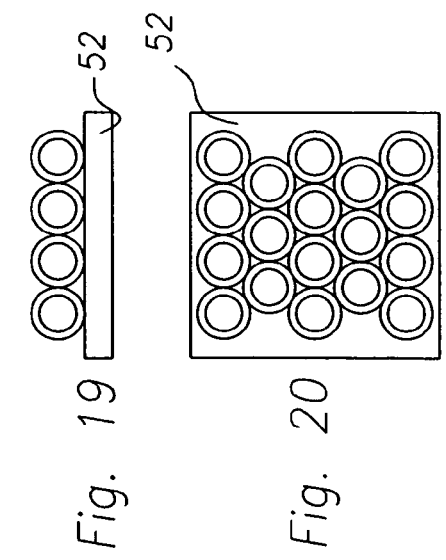
Fig. 15
Fig. 16
Fig. 17
Fig. 18
Fig. 19
Fig. 20
Fig. 21
Fig. 22
Fig. 23
Fig. 24

METHOD FOR FABRICATING CRYSTALLINE-DIELECTRIC THIN FILMS AND DEVICES FORMED USING SAME

This is a division of application Ser. No. 10/266,000 filed Oct. 7, 2002 now U.S. Pat. No. 6,737,364.

This invention relates to a method for forming and depositing thin films of crystalline dielectric materials on a substrate, and devices formed using this thin film technique. The thin film devices are made by the method of the invention and form a part of a variety of thin film devices, such as, capacitors, field effect transistors, memory devices and the like.

BACKGROUND OF THE INVENTION

In recent years there has been significant effort focused on integrating perovskite-type insulators (most notably Barium Strontium Titanate, or BST) into high-density DRAM memory structures. These materials are crystalline dielectric materials, which exhibit large dielectric responses (relative to conventional amorphous dielectric materials, such as $SiO_2$) due to ionic displacements within their crystal lattice. Similarly, there have been renewed efforts to develop viable high-density, non-volatile memory circuits based on ferroelectric dielectric materials. Ferroelectric materials are also crystalline dielectric materials and also possess the additional property of a permanent electric dipole moment whose orientation direction can be changed with an external electric field. From a fabrication standpoint, combining these crystalline dielectric materials with silicon processing poses serious difficulties. For example, forming the proper crystal structure (to obtain desired dielectric properties) requires high processing temperatures, which can have a detrimental effect on other parts of the circuit. Also, because these dielectric materials are crystalline, a film thereof has a grain structure and orientation that play a crucial role in determining device characteristics, such as leakage and polarization.

Recent work has shown that the grain size in crystalline dielectric films (in particular, much work has been done on BST) can be influenced somewhat by film deposition conditions. Upon crystallization to the high-dielectric phase, some films can become quite porous. Voids between grains in the dielectric can cause electrical shorts for sufficiently thin films. Problems associated with film grain size have become important as attempts are made to fabricate devices that are roughly the same size as the film granularity. These problems can be demonstrated with an example of a high density memory device.

Referring to FIG. 1, a high density memory device 10 includes a transistor 12 disposed below a capacitor 14. Transistor 12 and capacitor 14 are connected through a polycrystalline silicon (poly-Si) plug 16. The capacitor contains a crystalline dielectric material. FIG. 2 shows a difficulty in fabricating high density memory device 10. In order to obtain the proper crystal phase (with desirable properties) of the crystalline dielectric material, it is often necessary to subject the crystalline dielectric material to a high-temperature (>600° C.) anneal in oxygen. However, this process is detrimental to the rest of high-density memory device 10, because at high temperature, the oxygen diffuses down to and oxidizes poly-Si plug 16 it, converting it from a conductor to an insulator, thereby rendering high density memory device 10 inoperable.

Efforts have been made to develop a conducting barrier layer to place between a bottom electrode of capacitor 14 and poly-Si plug 16. The requirements for such a barrier are stringent, i.e., it must be electrically conducting, stop oxygen diffusion, and be non-reactive with oxygen at temperatures up to >600° C. These problems are major obstacles to the development high-density memory devices using crystalline dielectric materials.

SUMMARY OF THE INVENTION

The present invention pertains to a method for fabricating a thin film on a substrate. A plurality of nanoparticles that is initially in a solvent is deposited on the substrate in such a way that the nanoparticles form a monolayer on the substrate. The nanoparticles are coated with an organic surfactant and are electrically insulating with relative dielectric constant greater than 10. The percentage of the thin film comprised of nanoparticles is preferably in a range of about 50% to about 100%.

The nanoparticles preferably have a diameter size in the range between about 2 nm to about 20 nm. In another embodiment, the distribution of the diameter size in the thin film has a standard deviation selected from the group consisting of: less than 15%, less than 10% and less than 5%.

In another embodiment of the method of the invention, the nanoparticles are deposited from a solvent solution onto a liquid subphase. The solvent is then evaporated so that a closely packed monolayer of the nanoparticles is formed at the subphase liquid to air interface. A deposition step then transfers the closely packed monolayer of nanoparticles to the substrate.

In another embodiment of the method of the invention, the nanoparticles are heated or sintered after deposition on the substrate to form the thin film. Preferably, the surfactant is removed by the heating step.

The heating is carried out in a temperature range of preferably about 100° C. to about 800° C. and more preferably about 300° C. to about 650° C. The heating is carried out using a conventional oven or furnace, rapid thermal processing (RTA) or irradiation from a laser, a microwave, an electron beam or an ion beam.

Preferably, the above mentioned steps of depositing the nanoparticles on the substrate and heating the substrate and nanoparticles are repeated to increase thickness of the thin film.

Preferably, the nanoparticles are composed of a perovskite-type oxide having the formula $ABO_3$, wherein A is at least one additional cation having a positive formal charge in the range between about 1 to about 3; and wherein B is at least one acidic oxide containing a metal selected from Group IVB, VB, VIB, VIIB, IIIA, and IB metals.

The nanoparticles are preferably a pervoskite-type oxide selected from the group consisting of: a titanate-based ferroelectric, a manganate-based material, a cuprate based material, a tungsten bronze-type niobate, tantalate or titanate, or a layer bismuth tantalate, niobate, or titanate.

The nanoparticles are optionally a ferroelectric material selected from the group consisting of: bismuth titanate, strontium bismuth tantalate, strontium bismuth niobate, strontium bismuth tantalate niobate, lead zirconate titanate, lead lanthanum zirconate titanate, lead titanate, bismuth titanate, lithium niobate, lithium tantalate, strontium rhuthenate, barium titanite, strontium titanate and compositions of these materials modified by incorporation of a dopant.

The nanoparticles are preferably formed with a non-aqueous chemical process that injects metal oxide precursors at temperatures in the range between about 60° C. to about 300° C. or the precursors are added at low temperature and then heated to between about 60° C. to about 300° C.

In other embodiments, the nanoparticles are formed in a predetermined crystalline phase by synthesis or heating.

The solvent is preferably a material with an end functional group selected from the radical consisting of: —COO—, —CON—, —CN, —NC, —S—, —O—, —N—, —P—, —C=C—, and —C≡C—. The solvent is preferably evaporated at temperatures in the range between about 0° C. to about 150° C., more preferably between about 20° C. to about 40° C.

The solvent is preferably selected from the group consisting of: ethers, alcohols, arenes, chlorinated, fluorinated, —COO—, —CON—, —CN—, NC—, —S—, —O—, —N— and —P—.

The thin film produced according to the present invention can be used to fabricate capacitors, field effect transistors and other devices.

BRIEF DESCRIPTION OF THE DRAWING

Other and further objects, advantages and features of the present invention will be understood by reference to the following specification in conjunction with the accompanying drawings, in which like reference characters denote like elements of structure and:

FIG. 3 is a side view of a thin film device of the present invention in an intermediate process form;

FIG. 4 is a top view of FIG. 3;

FIG. 5 is a side view of a thin film device of the present invention in an intermediate process form;

FIG. 6 is a top view of FIG. 5;

FIG. 7 is a side view of a thin film device of the present invention in an intermediate process form;

FIG. 8 is a top view of FIG. 7;

FIG. 9 is a side view of a thin film device of the present invention in an intermediate process form;

FIG. 10 is a top view of FIG. 9;

FIG. 11 is a side view of a thin film device of the present invention in an intermediate process form;

FIG. 12 is a top view of FIG. 11;

FIG. 13 is a side view of a thin film device of the present invention;

FIG. 14 is a top view of FIG. 13;

FIG. 15 is a side view of a thin film device of the present invention in an intermediate process form;

FIG. 16 is a top view of FIG. 15;

FIG. 17 is a side view of a thin film device of the present invention in an intermediate process form;

FIG. 18 is a top view of FIG. 17;

FIG. 19 is a side view of a thin film device of the present invention in an intermediate process form;

FIG. 20 is a top view of FIG. 19;

FIG. 21 is a side view of a thin film device of the present invention in an intermediate process form;

FIG. 22 is a top view of FIG. 21;

FIG. 23 is a side view of a thin film device of the present invention; and

FIG. 24 is a top view of FIG. 23.

DETAILED DESCRIPTION OF THE INVENTION

Figure 1:
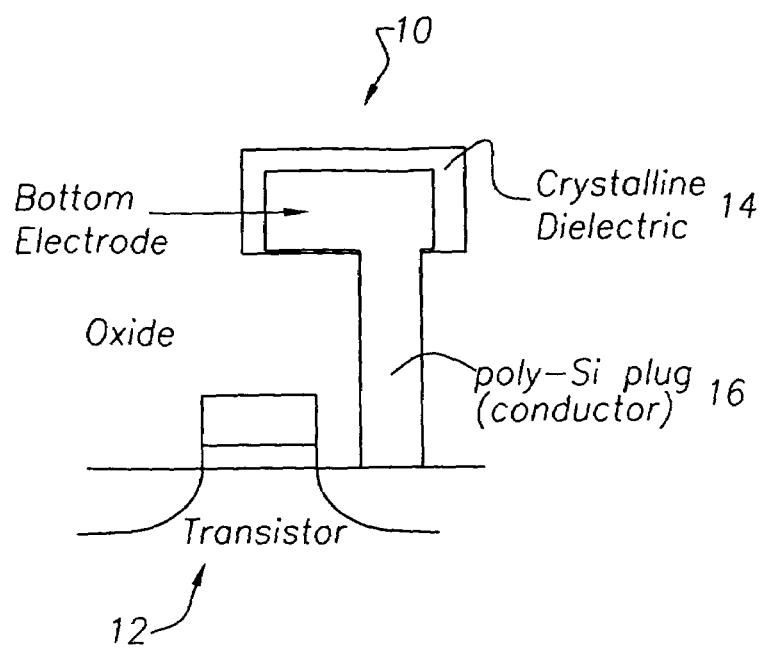
FIG. 1 is a side-view of a conventional high-density memory device.

A method is provided for processing crystalline dielectric materials, which avoids several of the problems hindering their integration into standard silicon processes. The present invention can be used to facilitate the integration of ferroelectric thin films, as well as other crystalline dielectrics, such as BST.

The chemistry of preparing an initial solution for the present method involves adjusting the chemical conditions to control the maximum size of the nanoparticles, and also to prevent them from agglomerating, and by coating the nanoparticles with an organic layer. Once the reaction is complete, the nanoparticles can be size-selected using well known centrifuge techniques. This results in a solution containing isolated, highly uniform nanoparticles of the appropriate composition.

In general, the nanoparticles for the present invention are uniformly sized and shaped in a range of about 2–50 nm and also exhibit high polarizability (with or without hysteresis). The nanoparticles have or adopt crystalline structures that are noncentrosymmetric and that display high polarizability due largely to a systematic distortion of the ionic lattice (i.e., distinct from limited polarization obtained in materials where only the electron distribution is distorted). The dielectric nanoparticles are not being limited to the perovskite family of structures, although the preferred embodiments feature this family. In the preferred embodiment, $BaTiO_3$ and $Ba_xSr(1-x)TiO_3$, adopt either the cubic 3 mm structure in the non-ferroelectric state, or the 4 mm tetragonal modification of the perovskite structure when in the ferroelectric state. Nanoparticles 20 may be composed of ferroelectric material including a perovskite-types oxide having the formula $ABO_3$ wherein A is at least one additional cation having a positive formal charge of from about 1 to about 3, and B is at least one acidic oxide containing at least one metal selected from the group consisting of: Group IVB, VB, VIB, VIIB, IIIA and IB metals of the Periodic Table of Elements. The perovskite-type oxide can also be at least one material selected from the group consisting of: a titanate-based ferroelectric, a manganate-based material, a cuprate based material, a tungsten bronze-type niobate, tantalate or titanate, or a layered bismuth tantalate, niobate, titanate; and more specifically, bismuth titanate, strontium bismuth tantalate, strontium bismuth niobate, strontium bismuth tantalate niobate, lead zirconate titanate, lead lanthanum zirconate titanate, lead titanate, bismuth titanate, lithium niobate, lithium tantalate, strontium rhuthenate, and compositions of these materials modified by incorporation of a dopant.

Nanoparticles composed of, for example, crystalline dielectric materials, are prepared in solution using chemical synthesis techniques. Starting with nanoparticles in solution, a thin-film is prepared by dip-coating a substrate with a nanoparticle monolayer formed on a liquid subphase (often referred to as a Langmuir-Blodgett technique).

Referring to FIGS. 3 and 4, a liquid subphase 40 is prepared. This subphase 40 may include water, ethylene glycol, propylene glycol, or mixtures thereof. Referring to FIGS. 5 and 6, nanoparticles 20 are deposited from the initial solution onto liquid subphase 40. After evaporation of the nanoparticle solvent, nanoparticles 20 are confined to the liquid-air interface (i.e., they float on the liquid). The nanoparticle solvent may include hexane, toluene, octane, chloroform or methylene chloride, as well as other suitable organic solvents. Nanoparticles 20 have been previously coated with an organic coating or surfactant 22, which prevents them from aggregating. Possible organic surfactants or stabilizers include molecules with end functional groups selected from the group consisting of: —COO— (e.g., RCOOH), —CON— (e.g., RCONH$_2$), —CN (e.g., RCN), —NC (RNC), —S— (e.g., RSH), —O— (e.g., ROH), —N— (e.g., R$_3$N), and —P— (e.g., R$_3$P) units, wherein R represents a hydrocarbon chain. In some circumstances, it may be advantageous to incorporate functional groups, such as C—C double bond (e.g., R1 —CH═CH—R$_2$), C≡C triple bond (e.g., R1-C—C—R$_2$), —COO— (e.g., R$_1$—COO—R$_2$), —CON— (e.g., R1-CONH—R$_2$), —S— (e.g., R$_1$—S—R$_2$), —O— (e.g., R$_1$—O—R$_2$), —N— (e.g., R$_1$—NH—R$_2$), or —P— (e.g., R$_1$—PH—R$_2$) type unit(s), where R$_1$ represent the hydrocarbon chain, while R$_2$ contains the end functional groups such as RCOOH, RCONH$_2$, RCN, RSH, ROH, into the stabilizer to enhance the film forming process. Techniques for attaching the stabilizer(s) or the organic surfactants to the nanoparticles include formation of chemical or physical bonds between the nanoparticles and the stabilizer(s).

Referring to FIGS. 7–10, compression of nanoparticles 20 on liquid subphase 40 packs them into an ordered monolayer 42, covering large areas with minimal space between nanoparticles 20. Monolayer 42 is then transferred onto a solid substrate 46 (FIG. 8), such as by dipping the solid substrate 46 onto liquid subphase 40.

Figure 2:
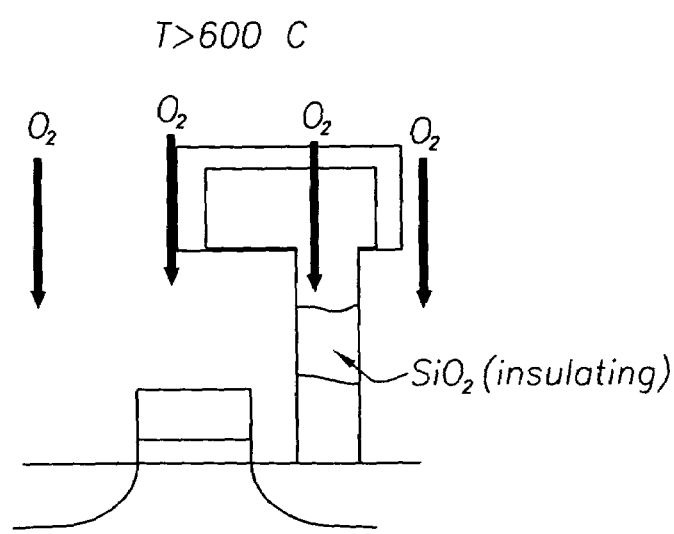
FIG. 2 shows the device of FIG. 1 being subjected to a high-temperature oxygen anneal.

Referring to FIGS. 9–14, annealing substrate 46 that contains monolayer 42 at high temperature removes organic surfactant 22 and sinters nanoparticles 20 together into a continuous film 30. Because of the large nanoparticle surface area, the sintering temperatures are reduced below that of a bulk material. Sintering of the films is carried out at temperatures in the range of between about 100° C. to about 800° C. Optimally, the films made according to the method of the present invention will be processed at lower temperatures for maximum benefit for integration of the materials with device designs. The preferred annealing/sintering conditions will be in an atmosphere with an inert gas (nitrogen, argon, helium) and oxygen. A temperature range of between about 300 to about 650° C. is preferred, which is just below the temperature in which annealing conventional devices in oxygen causes serious failures as described above with respect to FIGS. 1 and 2.

In another embodiment of the invention, referring to FIGS. 15–24, nanoparticles 20 are dispersed into a carrier solvent 50 and subsequently deposited onto a substrate 52. Substrate 52 may be heated (or kept at room temperature) to allow solvent 50 to evaporate. Evaporation of the carrier solvent 50 from the dispersion is carried out at temperatures in a range of 0° C. and 150° C., with a most desirable temperature range of about 20° C. to about 40° C. The temperature is selected to correlate with the volatility of the carrier solvent 50 so that the deposition of the film occurs in a period of between about 30 seconds to about 30 minutes with times in a range of between about 1 to about 10 minutes being most preferred (i.e., lower temperatures for more volatile solvents, high temperatures for less volatile solvents). If the evaporation is too rapid, it has been found that the resulting particle film is poorly ordered, and often exhibits significant porosity and a high level of defects, voids and cracks. If the drying is too slow the process time becomes inconvenient, increasing cost, but there is no upper limit on the time of evaporation for film quality. Generally, the solvent can be of any kind that can dissolve/disperse the particles, including solvents such as water, alcohol, an alkane (e.g., pentane, hexane, heptane, octane, etc.), an arene (e.g., benzene, toluene, seitylene, etc.), a chlorinated solvent (e.g., methylene chloride, chloroform, etc.) and the type with unit of —COO— (e.g., CH$_3$COOC$_2$H$_5$), —CON— (e.g., CH$_3$CONHC$_2$H$_5$), —CN (e.g., CH$_3$CN), —NC (e.g., CH$_3$COOC$_2$H$_5$), —S— (e.g., C$_4$H$_9$SC$_4$H$_9$), —O— (e.g., C$_2$H$_5$OC$_2$H$_5$, —N— (e.g., C$_4$H$_9$NH$_2$), or —P— (e.g., (C$_4$H$_9$)3P).

After solvent 50 evaporates, the remaining nanoparticles 20 are condensed into a close-packed arrangement on the surface of substrate 52. The next step anneals substrate 52 containing the nanoparticle monolayer 42 at a high temperature. This removes organic surfactant 22 surrounding nanoparticles 20 and sinters them together into a continuous film 54. Because of the large nanoparticle surface area, the sintering temperatures for the material are reduced below that of a bulk material. The dielectric film formed in accordance with these teachings is distinguishable from a film formed by conventional deposition techniques.

Important aspects of the present invention include the solution phase prefabrication of size uniform (monodisperse), ferroelectric/high-dielectric nanoparticles which are subsequently "assembled from solution" to form a closed packed dielectric particle array which in turn may be sintered or annealed to bring out the optimum properties. These key attributes can be easily detected. A routine high resolution transmission electron microscope or high resolution scanning electron microscope study of a cross-section of a structure will show the following:

(1) The grain-size distribution, and whether it conforms to a Gaussian distribution of sizes or a log normal distribution characteristic of other physical deposition methods. The film structure for a film fabricated in accordance with the present invention has an anomalously narrow grain-size distribution (i.e., less than about 15% standard deviation) which conforms to a Gaussian distribution of sizes, and not the log normal distribution characteristic of other physical deposition methods.

(2) The characteristic undercutting grains (i.e., dramatic prior to annealing/sintering and still distinctive after) at the dielectric film-substrate interface looks significantly different from the more hemispherical particles formed by physical deposition processes and sol-gel possesses, in which the particles conform much more closely to the substrate. The grains of the present invention may exhibit a characteristic near-spherical shape.

In addition, the film thickness and grain size are precisely controlled by the diameter of the particles formed in solution. Thicker films can be made by repeating the present method multiple times.

The numerous advantages of this technique, and the improvements it offers over more conventional approaches to making thin films of crystalline dielectrics are as follows. This technique offers precise control of the film grain size (down to ~1 nm), which aids in the formation of thin insulating dielectrics, and is beneficial to their integration into nanometer-scale device structures. Additionally, for the case of ferroelectric films, the orientation of the grains can be controlled, and one may thus align the ferroelectric polarization in the most desirable direction. Significantly, the formation of the correct crystal phase is done in solution, completely separate from the rest of the silicon circuit. High-temperature annealing therefore does not impact the performance of the circuit, as the dielectric film is deposited into the circuit at low temperature and in the proper phase.

Using the methods of the present invention, closely packed nanoparticle thin films are obtained in which the density of nanoparticles is in the range of about 50% to about 100%. Preferably, the range is about 90% to about 100% for heat treated thin films (relatively high dielectric response) and about 50% to about 60% for non-heat treated films or monolayers (relative low dielectric response), the remainder being composed primarily of organic material.

The present invention exploits the realization by the inventors that one can take the properties of the nanoparticles and produce a film with those same properties, and furthermore the processing conditions required to generate such a film may be advantageous compared to other methods.

It should be understood that the foregoing description is only illustrative of the present invention. Various alternatives and modifications can be devised by those skilled in the art without departing from the invention. Accordingly, the present invention is intended to embrace all such alternatives, modifications and variances that fall within the scope of the appended claims. Therefore, if the application calls for an electrically-conductive film (for example) rather than dielectrics, then if the nanoparticles are electrically conductive, the film can be made conductive.

In addition, a field effect transistor of the present invention is formed by use of the crystalline dielectric thin film as described above, in combination with a thin layer of organic, hybrid organic-inorganic, or inorganic semiconductor, or a semiconducting film formed of nanoparticles. In such a device an electric field is applied across the dielectric film in order to modulate the conductance of the semiconductor.

The field effect transistor may be formed, for example, by assembling the dielectric film on an electrically conductive substrate as a blanket continuous film by any of the means described herein, or by imprint lithography, screen printing, or inkjet printing as a patterned film. The deposited film may then be annealed to improve the dielectric properties.

Once the dielectric has been formed a semiconducting layer of organic, hybrid organic-inorganic, or inorganic semiconductor, or a semiconductor nanoparticle film can be deposited from the vapor phase, or solution deposited as a blanket film, or may be deposited by imprint lithography, screen printing, or inkjet printing to produce a patterned film. The semiconducting film may also be annealed to improve its electronic properties. At least two top contacts may then be formed in order to provide source and drain contacts.

Alternatively, the field effect transistor incorporating the dielectric film may be produced by first forming source and drain electrodes on a non-conducting rigid or flexible substrate (optimally SiO2 or a polymeric material). The semiconducting organic, hybrid organic-inorganic, or inorganic semiconductor or semiconductor nanoparticle film can be deposited from the vapor phase or from solution as a continuous blanket film, or may be deposited as a patterned film by imprint lithography, screen printing or inkjet printing. The semiconductor film may be annealed to improve its electronic properties.

The dielectric film is then deposited on top of the semiconductor either as a blanket film by the means described herein, or by imprint lithography, screen-printing or inkjet printing as patterned film. The deposited dielectric film may be annealed to improve its dielectric properties. Once the dielectric film has been formed, a top gate electrode can be formed by deposition of a conductive material on top of the dielectric film.

A capacitor according to the present invention is formed by use of the crystalline dielectric thin film as described above, in combination with thin layers of organic, hybrid organic-inorganic, or inorganic metallic, or a metallic film formed of nanoparticles. In such a device a voltage is applied across the dielectric film in order to store an electric charge in the capacitor.

The capacitor may be formed, for example, by assembling the dielectric film on an electrically conductive bottom electrode layer as a blanket continuous film by any of the means described herein, or by imprint lithography, screen printing, or inkjet printing as a patterned film. The deposited dielectric film may then be annealed to improve the dielectric properties. The bottom electrode layer may be formed of organic, hybrid organic-inorganic, or inorganic metallic, or a metallic film formed of nanoparticles.

Once the dielectric has been formed, a top metal electrode layer of organic, hybrid organic-inorganic, or inorganic metal, or a metal nanoparticle film can be deposited from the vapor phase, or solution deposited as a blanket film, or may be deposited by imprint lithography, screen printing, or inkjet printing to produce a patterned film. The top metal electrode film may also be annealed to improve its electronic properties.

What is claimed is:

1. A field effect transistor comprising: a source region and a drain region; a channel region comprising a semiconductor material; an insulating layer of electrically insulating material disposed over said channel region, and a gate electrode overlying said layer of electrically insulating material, wherein said layer of electrically insulating material is formed by the method which comprises:

depositing a plurality of nanoparticles on said substrate in such a way that said nanoparticles form a monolayer on said substrate; wherein said nanoparticles are coated with an organic surfactant, and wherein said nanoparticles are electrically insulating with relative dielectric constant greater than 10; and optionally heating said monolayer of nanoparticles to thereby form said thin film.

2. The field effect transistor of claim 1, wherein said semiconductor material is comprised of an organic material or a hybrid organic/inorganic material.

3. The field effect transistor of claim 1, wherein said nanoparticles are formed via a non-aqueous chemical process that injects metal oxide precursors at temperatures in a range between about 60° C. to about 300° C.

4. The field effect transistor of claim 1, wherein said nanoparticles are formed in a predetermined crystalline phase by either synthesizing or heating.

5. The field effect transistor of claim 1, wherein said method further comprises the step of repeating said depositing and heating steps, thereby increasing the thickness of said thin film.

* * * * *